United States Patent
Bacha

(10) Patent No.: US 8,040,710 B2
(45) Date of Patent: Oct. 18, 2011

(54) SEMICONDUCTOR MEMORY ARRANGEMENT

(75) Inventor: Abdallah Bacha, Munich (DE)

(73) Assignee: Qimonda AG, München (DE)

( * ) Notice: Subject to any disclaimer, the term of this patent is extended or adjusted under 35 U.S.C. 154(b) by 1167 days.

(21) Appl. No.: 11/756,541

(22) Filed: May 31, 2007

(65) Prior Publication Data

US 2008/0301349 A1    Dec. 4, 2008

(51) Int. Cl.
*G11C 5/06* (2006.01)
(52) U.S. Cl. .......................... 365/63; 710/305
(58) Field of Classification Search .................. 365/51, 365/63, 200; 710/305, 306; 361/735, 736, 361/760
See application file for complete search history.

(56) References Cited

U.S. PATENT DOCUMENTS

| | | | |
|---|---|---|---|
| 5,956,233 A * | 9/1999 | Yew et al. | 361/760 |
| 5,982,653 A * | 11/1999 | Chu | 365/63 |
| 6,115,278 A * | 9/2000 | Deneroff et al. | 365/52 |
| 6,160,718 A * | 12/2000 | Vakilian | 361/803 |
| 6,262,488 B1 * | 7/2001 | Masayuki et al. | 257/777 |
| 6,930,903 B2 * | 8/2005 | Bhakta et al. | 365/63 |
| 2002/0129215 A1 * | 9/2002 | Yoo et al. | 711/167 |
| 2005/0024963 A1 * | 2/2005 | Jakobs et al. | 365/202 |
| 2005/0044305 A1 * | 2/2005 | Jakobs et al. | 711/105 |
| 2005/0105318 A1 * | 5/2005 | Funaba et al. | 365/63 |
| 2006/0129712 A1 * | 6/2006 | Raghuram | 710/52 |
| 2006/0129755 A1 * | 6/2006 | Raghuram | 711/105 |
| 2007/0127304 A1 * | 6/2007 | Yoon et al. | 365/230.01 |
| 2007/0195613 A1 * | 8/2007 | Rajan et al. | 365/189.05 |
| 2008/0123305 A1 * | 5/2008 | Amidi et al. | 361/737 |
| 2009/0027940 A1 * | 1/2009 | Bacha | 365/51 |

* cited by examiner

*Primary Examiner* — Anh Phung
*Assistant Examiner* — Douglas King
(74) *Attorney, Agent, or Firm* — Cozen O'Connor

(57) ABSTRACT

A semiconductor memory arrangement includes a circuit board having at least a first layer and a second layer, a plurality of memory units, and a first control device and a second control device adapted to receive command and address signals. A first bus system is disposed in the first layer of the circuit board and coupled to the first control device and to a first group of memory units of the plurality of memory units to transmit the command and address signals to the first group of memory units. A second bus system is disposed in the second layer of the circuit board and coupled to the second control device and to a second group of memory units of the plurality of memory units to transmit the command and address signals to the second group of memory units.

27 Claims, 8 Drawing Sheets

SEMICONDUCTOR MEMORY ARRANGEMENT

DETAILED DESCRIPTION OF ILLUSTRATIVE EMBODIMENTS

Figure 1:
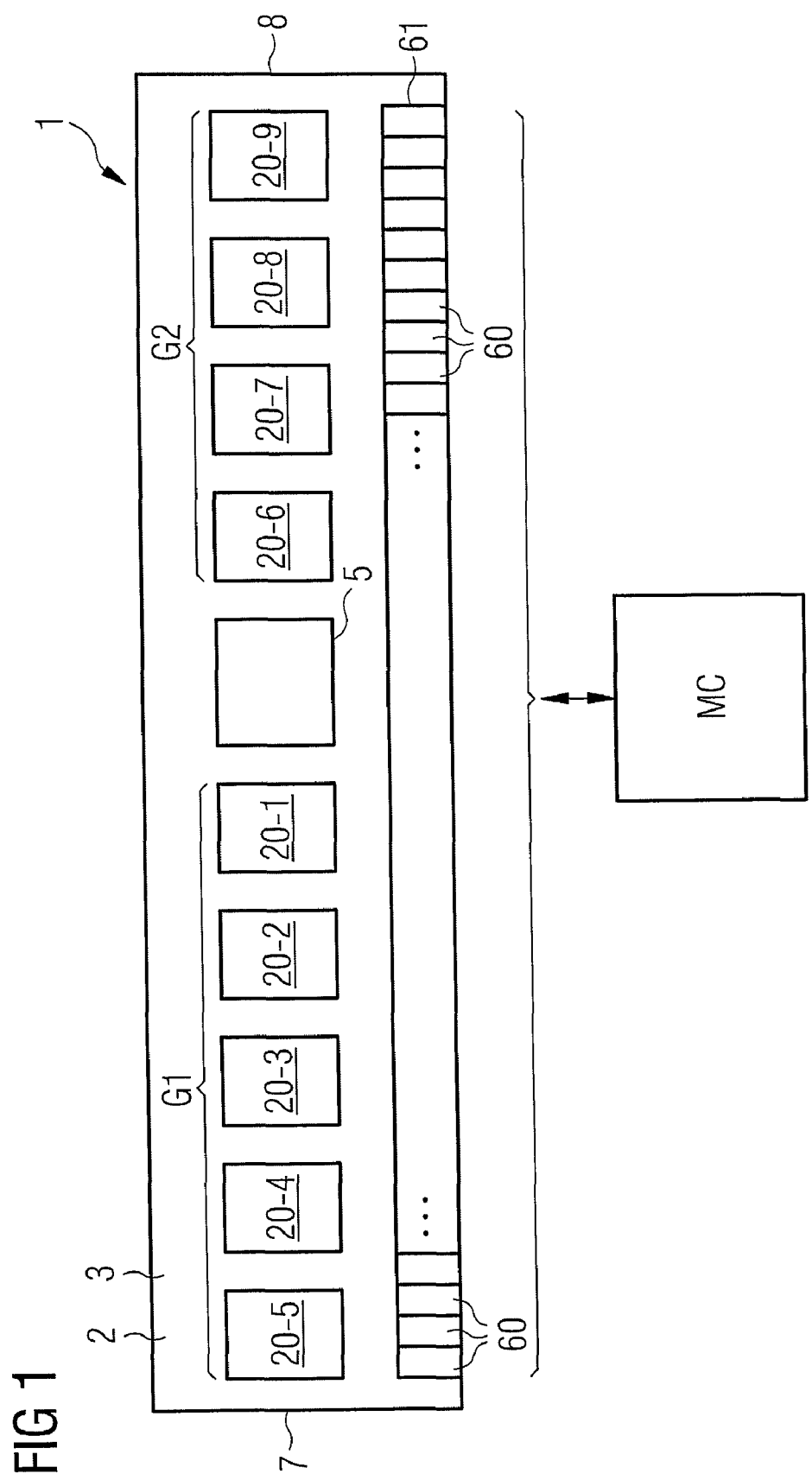
FIG. 1 shows an embodiment of a system topology comprising a controller component and a semiconductor memory arrangement.

FIG. 1 shows a system topology comprising a controller unit MC, for example a memory controller, and a semiconductor memory arrangement 1. In one embodiment, the semiconductor memory arrangement 1 is a semiconductor memory module. The semiconductor memory arrangement 1 comprises a substrate 2 having a first surface 3 and a first and a second end 7, 8. A plurality of memory units 20-1, . . . , 20-9 and a first control device 5 are disposed on the first surface 3 of the substrate 2.

A first group G1 of memory units 20-1, . . . , 20-5 of the plurality of memory units is disposed between the first end 7 of the substrate 2 and the first control device 5 and a second group G2 of memory units 20-6, . . . , 20-9 is disposed between the first control device 5 and the second end 8 of the substrate 2.

Furthermore, a connector element 61 comprising a multiplicity of contacts 60 is disposed at another end of the substrate 2. In one embodiment, the connector element 61 is an edge connector. The contacts 60 are coupled to inputs of the first control device 5 via conductive lines disposed in the substrate 2 (not shown in FIG. 1). In another embodiment, the conductive lines (not shown) are disposed on the substrate 2.

The controller unit MC is adapted to transmit signals, for example control signals, command and address signals and clock signals, to the first control device 5 via a bus system (not shown in FIG. 1) coupled to the contacts 60 of the connector element 61 of the substrate 2. Furthermore, the controller unit MC is adapted to receive signals from the control device 5 via the bus system.

Figure 2:
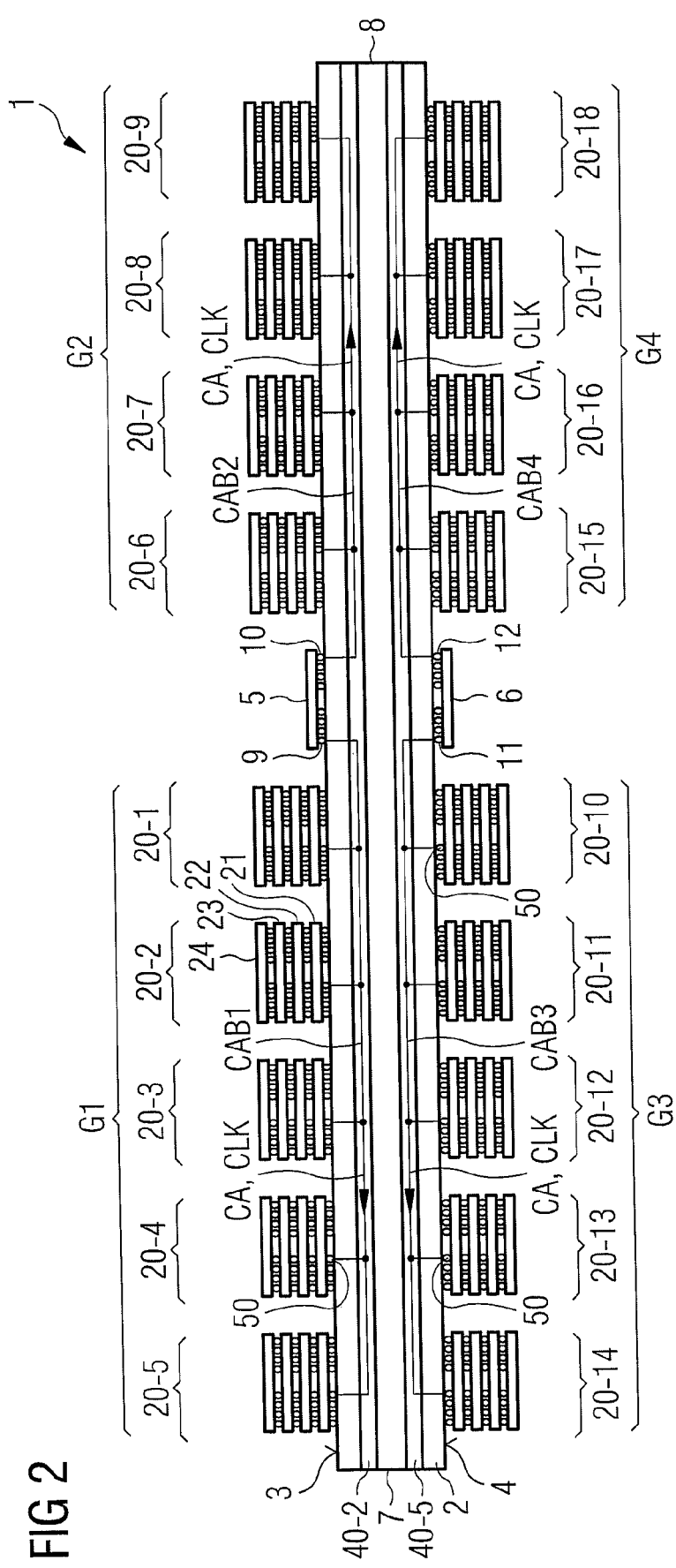
FIG. 2, FIG. 3, FIG. 4, FIG. 5 and FIG. 6 show cross-sectional views of embodiments of a semiconductor memory arrangement.

FIG. 2 shows a cross-sectional view of an embodiment of a semiconductor memory arrangement 1. The semiconductor memory arrangement 1 comprises a substrate 2 having a first surface 3, a second surface 4, a first end 7 and a second end 8. A first control device 5 is disposed on the first surface 3 of the substrate 2 and a second control device 6 is disposed on the second surface 4 of the substrate 2. In one embodiment, the semiconductor memory arrangement 1 is a semiconductor memory module, for example a Registered Dual In Line Memory Module (RDIMM).

A plurality of memory units 20-1, . . . , 20-18 is disposed on the substrate 2. Each of the memory units 20-1, . . . , 20-18 comprises a multiplicity of memory devices 21, 22, 23, 24 arranged in a stacked configuration on the substrate. In one embodiment, the memory devices are memory chips, for example dynamic random access memory (DRAM) chips or synchronous dynamic random access memory (SRAM) chips.

A first group G1 of memory units 20-1, . . . , 20-5 of the plurality of memory units is disposed on the first surface 3 of the substrate 2 and between the first end 7 of the substrate 2 and the first control device 5. A second group G2 of memory units 20-6, . . . , 20-9 of the plurality of memory units is disposed on the first surface 3 of the substrate 2 and between the first control device 5 and the second end 8 of the substrate 2.

A third group G3 of memory units 20-10, . . . , 20-14 of the plurality of memory units is disposed on the second surface 4 of the substrate 2 and between the first end 7 of the substrate 2 and the second control device 6. A fourth group G4 of memory units 20-15, . . . , 20-18 of the plurality of memory units is disposed on the second surface 4 of the substrate 2 and between the second control device 6 and the second end 8 of the substrate 2.

The memory units 20-01, . . . , 20-09 of the first group G1 of memory units and of the second group G2 of memory units each comprise a first memory device 21 disposed on the first surface 3 of the substrate 2, a second memory device 22 disposed on the first memory device 21, a third memory device 23 disposed on the second memory device 22 and a fourth memory device 24 disposed on the third memory device 23.

The memory units 20-10, . . . , 20-18 of the third group G3 of memory units and of the fourth group G4 of memory units each comprise a first memory device 21 disposed on the second surface 4 of the substrate 2, a second memory device 22 disposed on the first memory device 21, a third memory device 23 disposed on the second memory device 22 and a fourth memory device 24 disposed on the third memory device 23.

The substrate 2 comprises a first and a second conductive and structured layer 40-2, 40-5 disposed between the first surface 3 and the second surface 4. In one embodiment, the substrate 2 is a circuit board, for example a printed circuit board comprising a plurality of conductive layers disposed between the first surface 3 and the second surface 4, wherein respective other layers comprising an electrical isolating material are disposed between adjacent conductive layers.

The first and the second control devices 5, 6 are adapted to receive signals, for example control signals, command and address signals and clock signals from a controller such as the memory controller MC shown in FIG. 1, to buffer the received control signals, command and address signals and clock signals, to redrive the buffered control signals, the command and address signals and clock signals and to transmit the control signals, the command and address signals and the clock signals to respective groups of memory units. In one embodiment, the first and the second control devices 5, 6 are register chips.

The first and the second control device 2 5, 6 each comprise a first output 9, 11 and a second output 10, 12. Each of the memory units 20-1, . . . , 20-18 comprises an input 50.

A first bus system CAB1 comprising a multiplicity of conductive lines, wherein only one line is shown in FIG. 2, is disposed in the first layer 40-2 of the substrate 2 and coupled to the first control device 5 and to the memory units 20-1, . . . , 20-5 of the first group G1 of memory units to transmit the received command and address signals CA and the received clock signals CLK from the first control device 5 to the memory units of the first group G1 of memory units. For example, the one line of the first bus system CAB1 is coupled to the first output 9 of the first control device 5 and to the inputs 50 of the memory units of the first group G1 of memory units.

A second bus system CAB2 comprising a multiplicity of conductive lines, wherein only one line is shown in FIG. 2, is disposed in the first layer 40-2 of the substrate 2 and coupled to the first control device 5 and to the memory units 20-6, ..., 20-9 of the second group G2 of memory units to transmit the received command and address signals CA and the received clock signals CLK from the first control device 5 to the memory units of the second group G2 of memory units. For example, the one line of the second bus system CAB2 is coupled to the second output 10 of the first control device 5 and to the inputs 50 of the memory units of the second group G2 of memory units.

A third bus system CAB3 comprising a multiplicity of conductive lines, wherein only one line is shown in FIG. 2, is disposed in the second layer 40-5 of the substrate 2 and coupled to the second control device 6 and to the memory units 20-10, ..., 20-14 of the memory units of the third group G3 of memory units to transmit the received command and address signals CA and the received clock signals CLK from the second control device 6 to the memory units of the third group G3 of memory units. For example, the one line of the third bus system CAB3 is coupled to the first output 11 of the second control device 6 and to the inputs 50 of the memory units of the third group G3 of memory units.

A fourth bus system CAB4 comprising a multiplicity of conductive lines, wherein only one line is shown in FIG. 2, is disposed in the second layer 40-5 of the substrate 2 and coupled to the second control device 6 and to the memory units 20-14, ..., 20-18 of the fourth group G4 of memory units to transmit the received command and address signals CA and the received clock signals CLK from the second control device 6 to the memory units of the fourth group G4 of memory units. For example, the one line of the fourth bus system CAB4 is coupled to the second output 12 of the second control device 6 and to the inputs 50 of the memory units of the fourth group G4 of memory units.

Figure 3:
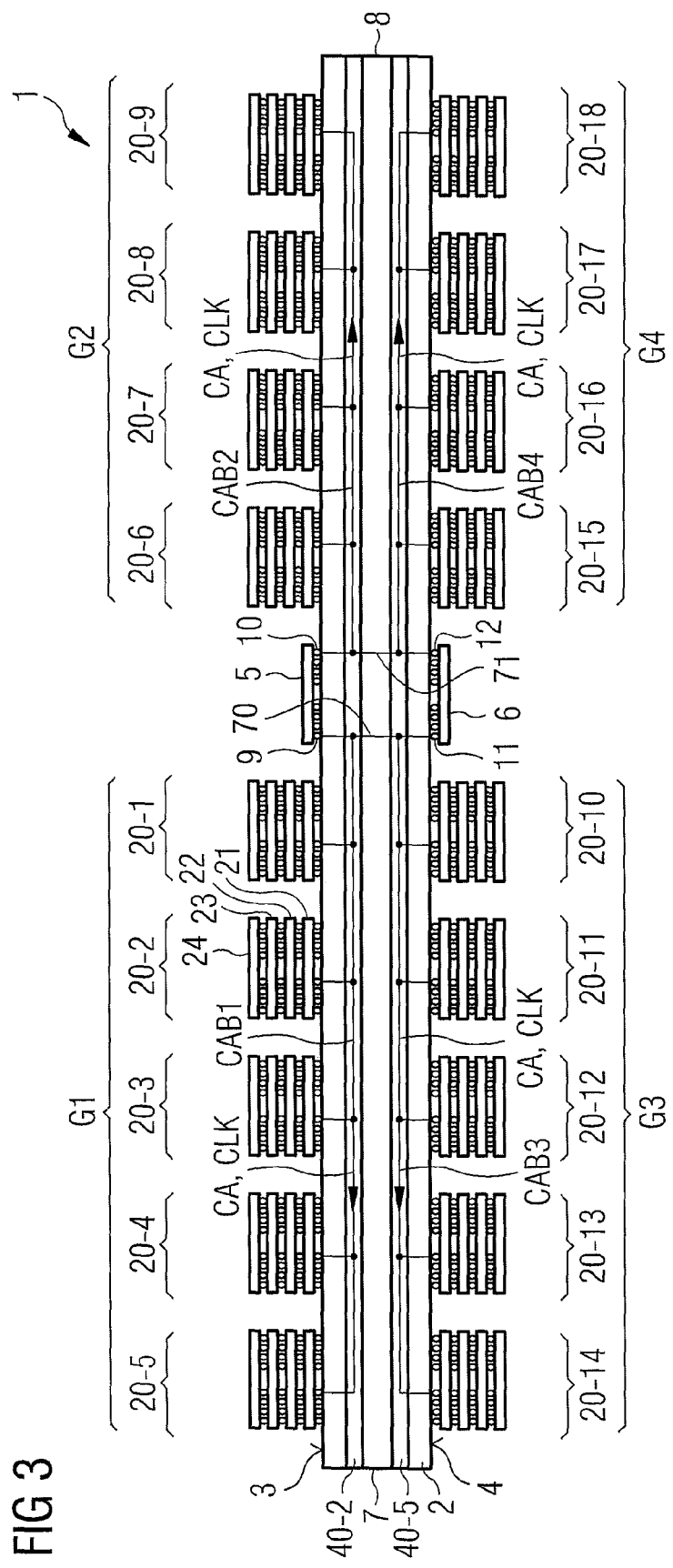

FIG. 3 shows a cross-sectional view of an embodiment of a semiconductor memory arrangement as shown in FIG. 2, wherein the first output 9 of the first control device 5 is extended by a contact hole 70 from the first surface 3 of the substrate 2 to the second surface 4 of the substrate 2 or the first output 11 of the second control device 6 is extended by the contact hole 70 from the second surface 4 of the substrate 2 to the first surface 3 of the substrate 2, wherein the contact hole 70 is filled with a conductive material. The contact hole 70 filled with the conductive material is further coupled to the first bus system CAB1 and to the third bus system CAB3.

Furthermore, the second output 10 of the first control device 5 is extended by a contact hole 71 from the first surface 3 of the substrate 2 to the second surface 4 of the substrate 2 or the second output 12 of the second control device 6 is extended by the contact hole 71 from the second surface 4 of the substrate 2 to the first surface 3 of the substrate 2, wherein the contact hole 71 is filled with a conductive material. The contact hole 71 filled with the conductive material is further coupled to the second bus system CAB2 and to the fourth bus system CAB4.

In this embodiment, the first control device 5 may be adapted to transmit the received command and address signals CA and the received clock signals CLK to either the memory units of the first and of the third groups G1, G3 of memory units or to the memory units of the second and of the fourth groups G2, G4 of memory units and the second control device 6 may be adapted to transmit the received command and address signals CA and the received clock signals CLK to the memory units of the second and of the fourth groups G2, G4 of memory units or to the memory units of the first and of the third groups G1, G3 of memory units.

In one embodiment, the first control device 5 is adapted to transmit the received command and address signals and the received clock signals via the first and third bus system CAB1, CAB3 to the memory units of the first and of the third groups G1, G3 of memory units of the plurality of memory units.

In another embodiment, the second control device 6 is adapted to transmit the received command and address signals and the received clock signals via the second and fourth bus systems CAB2, CAB4 to the memory units of the second and of the fourth groups G2, G4 of memory units of the plurality of memory units.

Furthermore, the first control device 5 is adapted to transmit the half of the received command and address signals and the half of the clock signals, and the second control device 6 is adapted to transmit the second half of the received command and address signals and the second half of the received clock signals via the first and third bus systems CAB1, CAB3 to the memory units of the first and of the third groups G1, G3 of memory units and via the second and fourth bus systems CAB2, CAB4 to the memory units of the second and of the fourth groups G2, G4 of memory units of the plurality of memory units.

Figure 4:
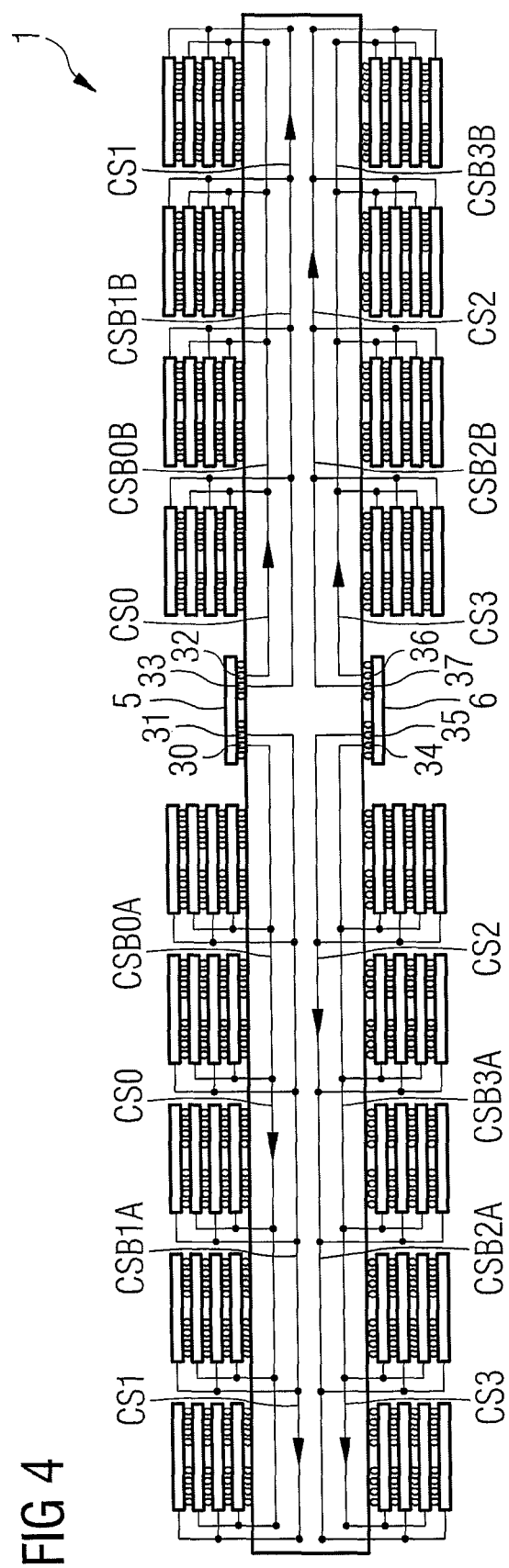

FIG. 4 depicts an embodiment of a semiconductor memory arrangement as shown in FIG. 2 or FIG. 3, wherein each of the first and second control devices 5, 6 comprise a third, a fourth, a fifth and a sixth output 30, ..., 37.

The first control device 5 is adapted to receive a first and a second device select signal CS0, CS1, for example a first and a second chip select signal from the controller unit MC shown in FIG. 1.

The first control device 5 is adapted to transmit the first device select signal CS0 to a subset of the memory chips 21, 22, 23, 24 of each of the memory units 20-1, ..., 20-5 of the first group G1 of the plurality of memory units and to transmit the second device select signal CS1 to another subset of the memory chips 21, 22, 23, 24 of each of the memory units 20-1, ..., 20-5 of the first group G1 of memory units of the plurality of memory units.

In one embodiment, the subset of the memory chips of each of the memory units of the first group G1 of memory units comprises at least two memory chips.

The first control device 5 is adapted to transmit the first device select signal CS0 to a subset of the memory chips 21, 22, 23, 24 of each of the memory units 20-6, ..., 20-9 of the second group G2 of memory units and to transmit the second device select signal CS1 to another subset of the memory chips 21, 22, 23, 24 of each of the memory units 20-6, ..., 20-9 of the second group G2 of memory units.

In one embodiment, the subset of the memory chips of each of the memory units of the second group G2 of memory units comprises at least two memory chips.

The second control device 6 is adapted to receive a third and a fourth device select signal CS2, CS3, for example a third and a fourth chip select signal from the controller unit MC shown in FIG. 1.

The second control device 6 is adapted to transmit the third device select signal CS2 to a subset of the memory chips 21, 22, 23, 24 of each of the memory units 20-10, ..., 20-14 of the third group G3 of memory units and to transmit the fourth device select signal CS3 to another subset of the memory chips 21, 22, 23, 24 of each of the memory units 20-10, ..., 20-14 of the third group G3 of memory units.

In one embodiment, the subset of the memory chips of each of the memory units 20-10, ..., 20-14 of the third group G3 of memory units comprises at least two memory chips.

The second control device 6 is adapted to transmit the third device select signal CS2 to a subset of the memory chips 21, 22, 23, 24 of each of the memory units 20-15, ..., 20-18 of the fourth group G4 of memory units and to transmit the fourth device select CS3 signal to another subset of the memory chips 21, 22, 23, 24 of each of the memory units 20-15, ..., 20-18 of the fourth group G4 of memory units.

In one embodiment, the subset of memory chips of each of the memory units of the fourth group G4 of memory units comprises at least two memory chips.

In one embodiment, the memory chips of the subset of each of the memory units 20-1, ..., 20-5 of the first group G1 of memory units and the memory chips of the subset of each of the memory units 20-6, ..., 20-9 of the second group G2 of memory units getting the first device select signal CS0 belong to a first rank of memory chips of the semiconductor memory arrangement.

The memory chips of the other subset of each of the memory units 20-1, ..., 20-5 of the first group G1 of memory units and the memory chips of the other subset of each of the memory units 20-6, ..., 20-9 of the second group G2 of memory units getting the second device select signal CS1 belong to a second rank of memory chips of the semiconductor memory arrangement.

The memory chips of the subset of each of the memory units 20-10, ..., 20-14 of the third group G3 of memory units and the memory chips of the subset of each of the memory units 20-15, ..., 20-18 of the fourth group G4 of memory units getting the third device select signal CS2 belong to a third rank of memory chips of the semiconductor memory arrangement.

The memory chips of the other subset of each of the memory units 20-10, ..., 20-14 of the third group G3 of memory units and the memory chips of the other subset of each of the memory units 20-15, ..., 20-18 of the fourth group G4 of memory units getting the fourth device select signal CS3 belong to a fourth rank of memory chips of the semiconductor memory arrangement.

The third output 30 of the first control device 5 is coupled via a conductive connection CSB0A to the first and to the third memory chips 21, 23 of each of the memory units 20-1, ..., 20-5 of the first group G1 of memory units to transmit the first device select signal CS0 to the first and to the third memory chips 21, 23 of each of the memory units of the first group G1 of memory units.

The fourth output 31 of the first control device 5 is coupled via a conductive connection CSB1A to the second and to the fourth memory chips 22, 24 of each of the memory units 20-1, ..., 20-5 of the first group G1 of memory units to transmit the second device select signal CS1 to the second and to the fourth memory chips 22, 24 of each of the memory units 20-1, ..., 20-5 of the first group G1 of memory units.

The fifth output 32 of the first control device 5 is coupled via a conductive connection CSB0B to the first and to the third memory chips 21, 23 of each of the memory units 20-6, ..., 20-9 of the second group G2 of memory units to transmit the first device select signal CS0 to the first and to the third memory chips 21, 23 of the memory units 20-6, ..., 20-9 of the second group G2 of memory units.

The sixth output 33 of the first control device 5 is coupled via a conductive connection CSB1B to the second and to the fourth memory chips 22, 24 of each of the memory units 20-6, ..., 20-9 of the second group G2 of memory units to transmit the second device select signal CS1 to the second and to the fourth memory chips 22, 24 of each of the memory units 20-6, ..., 20-9 of the second group G2 of memory units.

The third output 35 of the second control device 6 is coupled to the second and fourth memory chips 22, 24 of each of the memory units 20-10, ..., 20-14 of the third group G3 of memory units via a conductive connection CSB2A to transmit the third device select signal CS2 to the second and to the fourth memory chips 22, 24 of each of the memory units 20-10, 20-14 of the third group G3 of memory units.

The fourth output 34 of the second control device 6 is coupled to the first and to the third memory chip 21, 23 of each of the memory units 20-10, ..., 20-14 of the third group G3 of memory units via a conductive connection CSB3A to transmit the fourth device select signal CS3 to the first and to the third memory chips 21, 23 of each of the memory units of the third group G3 of memory units.

The fifth output 36 of the second control device 6 is coupled to the first and to the third memory chip 21, 23 of each of the memory units 20-15, ..., 20-18 of the fourth group G4 of memory units via a conductive connection CSB3B to transmit the fourth device select signal CS3 to the first and to the third memory chips 21, 23 of each of the memory units of the fourth group G4 of memory units.

The sixth output 37 of the second control device 6 is coupled to the second and to the fourth memory chips 22, 24 of each of the memory units 20-15, ..., 20-18 of the fourth group G4 of memory units via a conductive connection CSB2B to transmit the third device select signal to the second and to the fourth memory chips 22, 24 of each of the memory units of the fourth group G4 of memory units.

Figure 5:
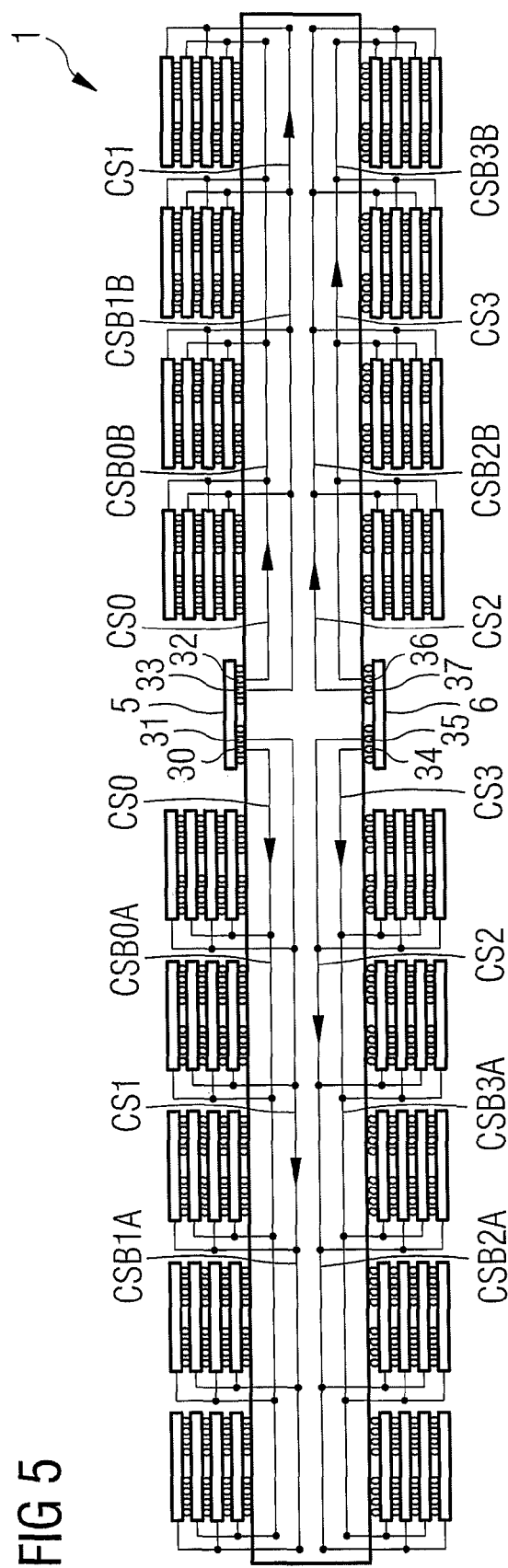

FIG. 5 depicts a cross-sectional view of an embodiment of a semiconductor arrangement as shown in FIG. 2 and FIG. 3, wherein each of the first and second control devices 5, 6 comprises a third, a fourth, a fifth and a sixth output 30, ..., 37.

The first control device 5 is adapted to receive a first and a second device select signal CS0, CS1, for example a first and a second chip select signal from the controller unit MC shown in FIG. 1.

The third output 30 of the first control device 5 is coupled via a conductive connection CSB0A to the first and to the third memory chips 21, 23 of the memory units 20-1, 20-3, 20-5, and to the second and to the fourth memory chips 22, 24 of the memory units 20-2, 20-4 of the first group G1 of memory units to transmit the first device select signal CS0 to the first and to the third memory chips 21, 23 of the memory units 20-1, 20-3, 20-5 and to the second and to the fourth memory chips 22, 24 of the memory units 20-2, 20-4 of the first group G1 of memory units.

The fourth output 31 of the first control device 5 is coupled via a conductive connection CSB1A to the second and to the fourth memory chips 22, 24 of the memory units 20-1, 20-3, 20-5, and to the first and to the third memory chips 21, 23 of the memory units 20-2, 20-4 of the first group G1 of memory units to transmit the second device select signal CS1 to the second and to the fourth memory chips 22, 24 of the memory units 20-1, 20-3, 20-5, and to the first and to the third memory chips 21, 23 of the memory units 20-2, 20-4 of the first group G1 of memory units.

The fifth output 32 of the first control device 5 is coupled via a conductive connection CSB0B to the first and to the third memory chips 21, 23 of the memory units 20-7, 20-9, and to the second and to the fourth memory chips 22, 24 of the memory units 20-6, 20-8 of the second group G2 of memory units to transmit the first device select signal CS0 to the first and to the third memory chips 21, 23 of the memory units 20-7, 20-9 and to the second and to the fourth memory chips 22, 24 of the memory units 20-6, 20-8 of the second group G2 of memory units.

The sixth output 33 of the first control device 5 is coupled via a conductive connection CSB1B to the second and to the fourth memory chips 22, 24 of the memory units 20-7, 20-9, and to the first and to the third memory chips 21, 23 of the memory units 20-6, 20-8 of the second group G2 of memory units to transmit the second device select signal CS1 to the second and to the fourth memory chips 22, 24 of the memory units 20-7, 20-9, and to the first and to the third memory chips 21, 23 of the memory units 20-6, 20-8 of the second group G2 of memory units.

The third output 35 of the second control device 6 is coupled to the second and to the fourth memory chips 22, 24 of the memory units 20-10, 20-12, 20-14, and to the first and to the third memory chips 21, 23 of the memory units 20-11, 20-13 of the third group G3 of memory units via a conductive connection CSB2A to transmit the third device select signal CS2 to the second and to the fourth memory chips 22, 24 of the memory units 20-10, 20-12, 20-14, and to the first and to the third memory chips 21, 23 of the memory units 20-11, 20-13 of the third group G3 of memory units.

The fourth output 34 of the second control device 6 is coupled to the first and to the third memory chips 21, 23 of the memory units 20-10, 20-12, 20-14, and to the second and to the fourth memory chips 22, 24 of the memory units 20-11, 20-13 of the third group G3 of memory units via a conductive connection CSB3A to transmit the fourth device select signal CS3 to the first and to the third memory chips 21, 23 of the memory units 20-10, 20-12, 20-14, and to the second and to the fourth memory chips 22, 24 of the memory units 20-11, 20-13 of the third group G3 of memory units.

The fifth output 36 of the second control device 6 is coupled to the second and to the fourth memory chips 21, 23 of the memory units 20-15, 20-17, and to the first and to the third memory chips 21, 23 of the memory units 20-16, 20-18 of the fourth group G4 of memory units via a conductive connection CSB3B to transmit the fourth device select signal CS3 to the second and to the fourth memory chips 22, 24 of the memory units 20-15, 20-17, and to the first and to the third memory chips 21, 23 of the memory units 20-16, 20-18 of the fourth group G4 of memory units.

The sixth output 37 of the second control device 6 is coupled to the first and to the third memory chips 21, 23 of the memory units 20-15, 20-17, and to the second and to the fourth memory chips 22, 24 of the memory units 20-16, 20-18 of the fourth group G4 of memory units via a conductive connection CSB2B to transmit the third device select signal CS2 to the first and to the third memory chips 21, 23 of the memory units 20-15, 20-17, and to the second and to the fourth memory chips 22, 24 of the memory units 20-16, 20-18 of the fourth group G4 of memory units.

Figure 6:
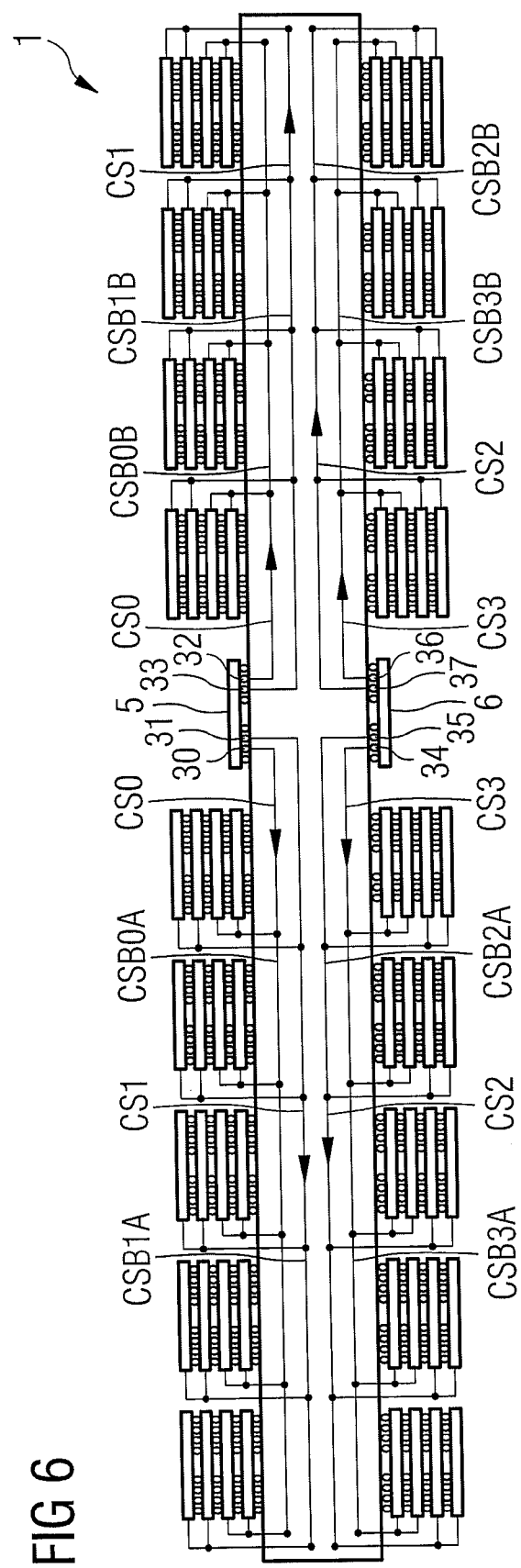

FIG. 6 depicts a cross-sectional view of an embodiment of a semiconductor arrangement as shown in FIG. 2 and FIG. 3, wherein each of the first and second control devices 5, 6 comprises a third, a fourth, a fifth and a sixth output 30, . . . , 37.

The first control device 5 is adapted to receive a first and a second device select signal CS0, CS1, for example a first and a second chip select signal from the controller component MC shown in FIG. 1.

The third output 30 of the first control device 5 is coupled via a conductive connection CSB0A to the first and to the second memory chips 21, 22 of each of the memory units 20-1, . . . , 20-5 of the first group G1 of memory units to transmit the first device select signal CS0 to the first and to the second memory chips 21, 22 of each of the memory units 20-1, . . . , 20-5 of the first group G1 of memory units.

The fourth output 31 of the first control device 5 is coupled via a conductive connection CSB1A to the third and to the fourth memory chips 23, 24 of each of the memory units 20-1, . . . , 20-5 of the first group G1 of memory units to transmit the second device select signal CS1 to the third and to the fourth memory chips 23, 24 of each of the memory units 20-1, . . . , 20-5 of the first group G1 of memory units.

The fifth output 32 of the first control device 5 is coupled via a conductive connection CSB0B to the first and to the second memory chips 21, 22 of each of the memory units 20-6, . . . , 20-9 of the second group G2 of memory units to transmit the first device select signal CS0 to the first and to the second memory chips 21, 22 of the memory units 20-6, . . . , 20-9 of the second group G2 of memory units.

The sixth output 33 of the first control device 5 is coupled via a conductive connection CSB1B to the third and to the fourth memory chips 23, 24 of each of the memory units 20-6, . . . , 20-9 of the second group G2 of memory units to transmit the second device select signal CS1 to the third and to the fourth memory chips 23, 24 of each of the memory units 20-6, . . . , 20-9 of the second group G2 of memory units.

The third output 35 of the second control device 6 is coupled to the third and fourth memory chips 23, 24 of each of the memory units 20-10, . . . , 20-14 of the third group G3 of memory units via a conductive connection CSB2A to transmit the third device select signal CS2 to the third and to the fourth memory chips 23, 24 of each of the memory units 20-10, . . . , 20-14 of the third group G3 of memory units.

The fourth output 34 of the second control device 6 is coupled to the first and to the second memory chips 21, 22 of each of the memory units 20-10, . . . , 20-14 of the third group G3 of memory units via a conductive connection CSB3A to transmit the fourth device select signal CS3 to the first and to the second memory chips 21, 22 of each of the memory units 20-10, . . . , 20-14 of the third group G3 of memory units.

The fifth output 36 of the second control device 6 is coupled to the first and to the second memory chips 21, 22 of each of the memory units 20-15, . . . , 20-18 of the fourth group G4 of memory units via a conductive connection CSB3B to transmit the fourth device select signal CS3 to the first and to the second memory chips 21, 22 of each of the memory units 20-15, . . . , 20-18 of the fourth group of memory units.

The sixth output 37 of the second control device 6 is coupled to the third and to the fourth memory chips 23, 24 of each of the memory units 20-15, . . . , 20-18 of the fourth group G4 of memory units via a conductive connection CSB2B to transmit the third device select signal CS2 to the third and to the fourth memory chips 22, 24 of each of the memory units 20-15, 20-18 of the fourth group G4 of memory units.

Figure 7:
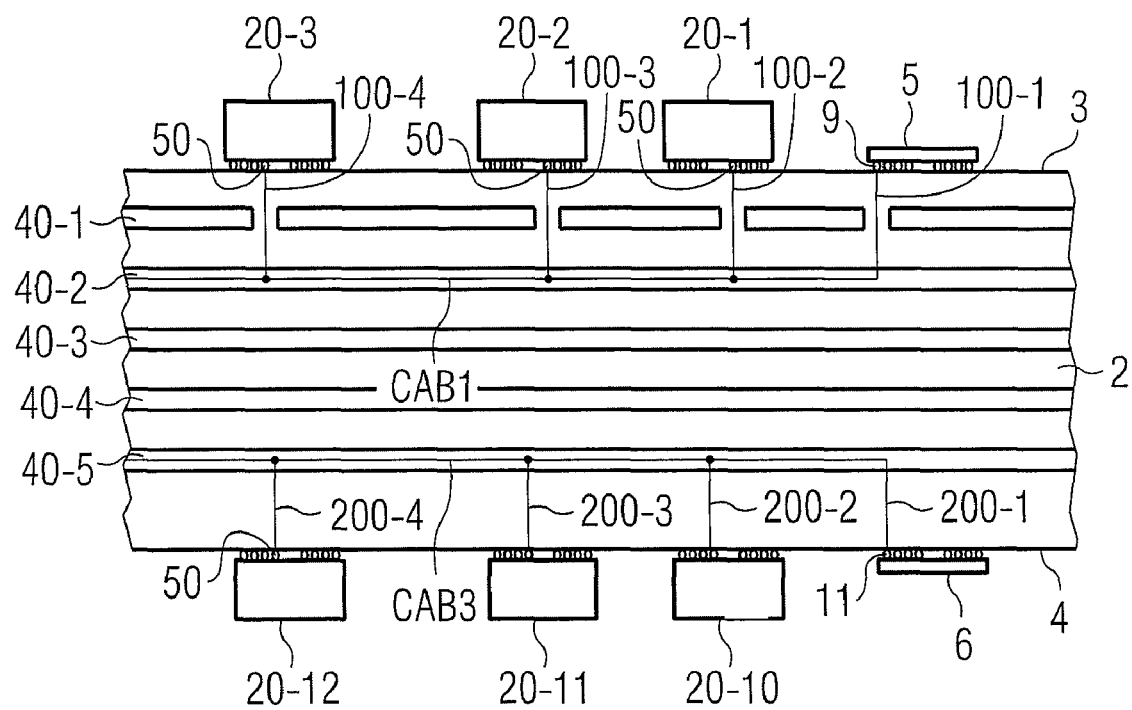
FIG. 7 shows a section of a cross-sectional view of an embodiment of a semiconductor memory arrangement.

FIG. 7 shows a section of a cross-sectional view of an embodiment of a semiconductor memory arrangement, wherein the substrate 2 comprises a multiplicity of conductive and structured layers 40-1, . . . , 40-5. The first output 9 of the first control device 5 is coupled via a conductive line 100-1 extending from the first surface 3 of the substrate 2 to a line of the first bus system CAB1. Furthermore, conductive lines 100-2, 100-3, 100-4 extend from the line of the first bus system CAB1 to respective inputs 50 of memory units 20-1, . . . , 20-3 of the first group G1 of memory units.

The first output 11 of the second control device 6 is coupled via a conductive line 200-1 extending from the second surface 4 of the substrate 2 to a line of the third bus system CAB3. Furthermore, conductive lines 100-2, 100-3, 100-4 extend from the line of the third bus system CAB3 to respective inputs 50 of memory units 20-10, ..., 20-12 of the third group G3 of memory units.

Figure 8:
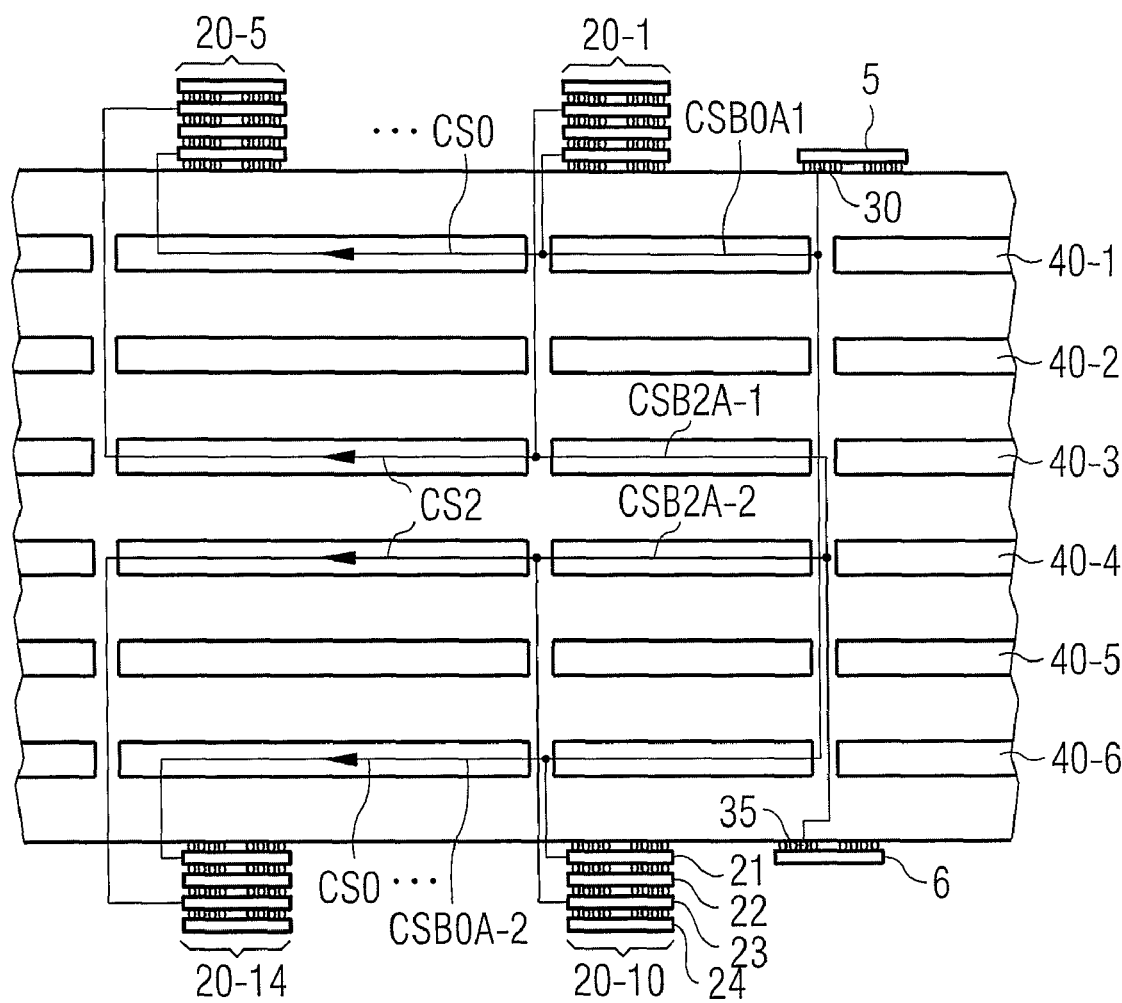
FIG. 8 shows a section of a cross-sectional view of an embodiment of a semiconductor memory arrangement.

FIG. 8 shows a section of a cross-sectional view of an embodiment of a semiconductor memory arrangement, wherein the substrate 2 comprises a multiplicity of conductive and structured layers 40-1, ..., 40-6 disposed between the first surface 3 and the second surface 4 of the substrate 2. The first control device 5 is disposed on the first surface 3 of the substrate 2 and is adapted to receive a first device select signal CS0. The second control device 6 is disposed on the second surface 4 of the substrate 2 and is adapted to receive a third device select signal CS2.

The third output 30 of the first control device 5 is coupled via a conductive connection CSB0A-1 disposed in a first layer 40-1 of the multiplicity of layers to the first memory chips 21 of the memory units 20-1, ..., 20-5 of the first group G1 of memory units of the plurality of memory units and via a conductive connection CSB0A-2 disposed in a second layer 40-6 of the multiplicity of layers to the first memory chips 21 of the memory units 20-10, ..., 20-14 of the third group G3 of memory units of the plurality of memory units to transmit the first device select signal CS0 to the first memory chips 21 of the memory units 20-1, ..., 20-5, 20-10, ..., 20-14 of the first group G1 and of the third group G3 of memory units of the plurality of memory units.

The third output 35 of the second control device 6 is coupled via a conductive connection CSB2A-1 disposed in a third layer 40-3 of the multiplicity of layers to the third memory chips 23 of the memory units 20-1, ..., 20-5 of the first group G1 of memory units of the plurality of memory units and via a conductive connection CSB2A-2 disposed in a fourth layer 40-4 of the multiplicity of layers to the third memory chips 23 of the memory units 20-10, ..., 20-14 of the third group G3 of memory units of the plurality of memory units to transmit the third device select signal CS2 to the third memory chips 23 of the memory units 20-1, ..., 20-5, 20-10, 20-14 of the first group G1 and of the third group G3 of memory units of the plurality of memory units.

While specific embodiments have been described in detail in the foregoing description and illustrated in the accompanying drawings, those with ordinary skill in the art will appreciate that various modifications and alternatives to those details could be developed in the light of the overall teachings of the disclosure. Accordingly, the particular arrangements disclosed are meant to be illustrative only and not limiting as to the scope of the invention, which is to be given the breadth of the appended claims and any and all equivalents thereof.

What is claimed is:

1. A semiconductor memory arrangement comprising:
   a circuit board having at least a first layer and a second layer, said circuit board has a first end and a second end and a first surface and a second surface;
   a plurality of memory units;
   a first control device and a second control device adapted to receive command and address signals;
   a first bus system disposed in said first layer of said circuit board and coupled to said first control device and to a first group of memory units of said plurality of memory units to transmit said command and address signals to said first group of memory units; and
   a second bus system disposed in said second layer of said circuit board and coupled to said second control device and to a second group of memory units of said plurality of memory units to transmit said command and address signals to said second group of memory units,
   wherein the first bus system is electrically separate from the second bus system,
   wherein said first group of memory units is disposed on said first surface of said circuit board and between said first end of said circuit board and said first control device;
   wherein said second group of memory units is disposed on said second surface of said circuit board and between said first end of said circuit board and said second control device, and
   wherein each of said memory units includes a plurality of memory chips, said first control device adapted to receive a first device select signal and a second device select signal and to transmit said first device select signal to a subset of each of said plurality of memory chips of said first group of memory units and to transmit said second device select signal to another subset of each of said plurality of memory chips of said first group of memory units.

2. The semiconductor memory arrangement according to claim 1, wherein said second bus system is coupled to said first control device to transmit said command and address signals from said first control device to said second group of memory units.

3. The semiconductor memory arrangement according to claim 1, further comprising:
   a third bus system disposed in said first layer of said circuit board and coupled to said first control device and to a third group of memory units of said plurality of memory units to transmit said command and address signals from said first control device to said third group of memory units; and
   a fourth bus system disposed in said second layer of said circuit board and coupled to said second control device and to a fourth group of memory units of said plurality of memory units to transmit said command and address signals from said second control device to said fourth group of memory units.

4. The semiconductor memory arrangement according to claim 1, wherein said second control device is adapted to receive a third device select signal and a fourth device select signal and to transmit said third device select signal to a subset of said plurality of memory chips of each of said memory units of said second group and to transmit said fourth device select signal to another subset of said plurality of memory chips of each of said memory units of said second group.

5. The semiconductor memory arrangement according to claim 4, wherein said subset of said plurality of memory chips of said memory units of said first group comprises at least two memory chips.

6. The semiconductor memory arrangement according to claim 1, further comprising a third bus system disposed in said second layer of said circuit board and coupled to said first control device and to a third group of memory units of said plurality of memory units to transmit said command and address signals from said first control device to said third group of memory units.

7. A semiconductor memory module comprising:
   a circuit board having a first surface and a second surface and a plurality of layers disposed between said first surface and said second surface;
   a plurality of memory units each including a plurality of memory chips arranged in a stacked configuration;
   a first control chip disposed on said first surface of said circuit board and a second control chip disposed on said second surface of said circuit board, said first and second control chips being adapted to receive command and address signals;
a first bus system disposed in a first one of said plurality of layers of said circuit board and coupled to said first control chip and to a first group of memory units of said plurality of memory units to transmit said command and address signals to said first group of memory units; and
a second bus system disposed in another layer of said plurality of layers of said circuit board and coupled to said second control chip and to a second group of memory units of said plurality of memory units to transmit said command and address signals to said second group of memory units,
wherein the first bus system is electrically separate from the second bus system, and
wherein each of said memory units includes a plurality of memory chips, said first control device adapted to receive a first device select signal and a second device select signal and to transmit said first device select signal to a subset of each of said plurality of memory chips of said first group of memory units and to transmit said second device select signal to another subset of each of said plurality of memory chips of said first group of memory units.

8. The semiconductor memory module according to claim 7, wherein said first control chip is adapted to receive a first chip select signal and a second chip select signal and to transmit said first chip select signal to a subset of said plurality of memory chips of each of said plurality of memory units of said first group and to transmit said second chip select signal to another subset of said plurality of memory chips of each of said plurality of memory units of said first group.

9. The semiconductor memory module according to claim 8, wherein said plurality of memory chips of said plurality of memory units of said first group comprises a first memory chip disposed on said first surface of said circuit board, a second memory chip disposed on said first memory chip, a third memory chip disposed on said second memory chip and a fourth memory chip disposed on said third memory chip.

10. The semiconductor memory module according to claim 9, wherein said first control chip is adapted to transmit said first chip select signal to said first memory chip and to said third memory chip of each of said plurality of memory units of said first group and to transmit said second chip select signal to said second memory chip and said fourth memory chip of each of said plurality of memory units of said first group.

11. The semiconductor memory module according to claim 9, wherein said first control chip is adapted to transmit said first chip select signal to said first memory chip and to said second memory chip of said plurality of memory chips of each of said memory units of said first group and to transmit said second chip select signal to said third memory chip and to said fourth memory chip of said plurality of memory chips of each of said memory units of said first group.

12. The semiconductor memory module according to claim 7, wherein said first control chip is adapted to receive a first device select signal and to transmit said first device select signal to a subset of said plurality of memory chips of each of said plurality of memory units of said first group of memory units and to another subset of said plurality of memory chips of each of said plurality of memory units of said second group of memory units.

13. A semiconductor memory arrangement, comprising:
a substrate;
a plurality of memory units, each memory unit including a plurality of memory chips arranged in a stacked configuration on said substrate, said plurality of memory chips comprising a subset of memory chips including at least two memory chips and another subset of memory chips; and
a control device adapted to receive command and address signals and a first device select signal and a second device select signal and to transmit said command and address signals to a group of memory units of said plurality of memory units and to transmit said first device select signal to said subset of memory chips of each of said memory units of said group of memory units and to transmit said second device select signal to said another subset of memory chips of each of said memory units of said group of memory units.

14. The semiconductor memory arrangement according to claim 13, further comprising another control device configured to receive said command and address signals and to transmit said command and address signals to another group of memory units of said plurality of memory units.

15. The semiconductor memory arrangement according to claim 14, wherein said another control device is adapted to receive a third device select signal and a fourth device select signal and to transmit said third device select signal to a subset of said memory units of said another group of memory units and to transmit said fourth device select signal to another subset of said another group of memory units.

16. The semiconductor memory arrangement according to claim 15,
wherein said substrate comprises a first end and a second end and a first surface and a second surface,
wherein said group of memory units are disposed on said first surface of said substrate between said first end and said control device, and
wherein said another group of memory units are disposed on said second surface of said substrate between said first end and said another control device.

17. A semiconductor memory system, comprising:
a controller;
a circuit board having a plurality of layers, said circuit board has a first end and a second end and a first surface and a second surface;
a plurality of memory units;
a first control chip and a second control chip coupled to said controller to receive command and address signals;
a first bus system disposed in a first layer of said plurality of layers of said circuit board and coupled to said first control chip and to a first group of memory units of said plurality of memory units to transmit said command and address signals to said first group of memory units, said first group of memory units are disposed on said first surface of said circuit board between said first end and said first control chip; and
a second bus system disposed in a second layer of said plurality of layers of said circuit board and coupled to said second control chip and to a second group of memory units of said plurality of memory units to transmit said command and address signals to said second group of memory units, said second group of memory units is disposed on said second surface of said circuit board between said first end and said second control chip, wherein the first bus system is electrically separate from the second bus system, and each of said plural memory units includes a plurality of memory chips arranged in a stacked configuration on said circuit board, said first control chip adapted to receive a first chip select signal and a second chip select signal and to transmit said first chip select signal to a subset of said plurality of memory chips of said first group of memory units and to transmit said second chip select signal to another subset of said plurality of memory chips of said first group of memory units.

18. The semiconductor memory system according to claim 17, further comprising:

a third bus system disposed in said first layer of said plurality of layers of said circuit board and coupled to said first control chip and to a third group of memory units of said plurality of memory units to transmit said command and address signals from said first control chip to said third group of memory units; and a fourth bus system disposed in said second layer of said plurality of layers of said circuit board and coupled to said second control chip and to a fourth group of memory units of said plurality of memory units to transmit said command and address signals from said second control chip to said fourth group of memory units.

19. The semiconductor memory system according to claim 17, wherein said second control chip is adapted to receive a third chip select signal and a fourth chip select signal and to transmit said third chip select signal to a subset of said plurality of memory chips of each of said memory units of said third group and to transmit said fourth chip select signal to another subset of said plurality of memory chips of each of said memory units of said third group.

20. The semiconductor memory system according to claim 17, wherein each of said memory units comprises a plurality of memory chips and wherein said first control chip is adapted to receive a first device select signal and to transmit said first device select signal to a subset of said plurality of memory chips of said memory units of said first group of memory units and to transmit said first device select signal to a subset of said plurality of memory chips of said memory units of said second group of memory units.

21. The semiconductor memory system according to claim 20, wherein said subset of said plurality of memory chips of said memory units of said first group of memory units comprises at least two memory chips.

22. The semiconductor memory system according to claim 17, further comprising a third bus system disposed in said second layer of said plurality of layers and coupled to said first control chip and to a third group of memory units of said plurality of memory units to transmit said command and address signals from said first control chip to said third group of memory units.

23. A semiconductor memory system comprising:

a controller;

a circuit board having a first surface and a second surface and a plurality of layers disposed between said first surface and said second surface;

a plurality of memory units, each memory unit including a plurality of memory chips arranged in a stacked configuration;

a first control chip disposed on said first surface of said circuit board and a second control chip disposed on said second surface of said circuit board, said first control chip and said second control chip being coupled to said controller to receive command and address signals;

a first bus system disposed in a first layer of said plurality of layers of said circuit board and coupled to said first control chip and to a first group of memory units of said plurality of memory units to transmit said command and address signals to said first group of memory units; and a second bus system disposed in a second layer of said plurality of layers of said circuit board and coupled to said second control chip and to a second group of memory units of said plurality of memory units to transmit said command and address signals to said second group of memory units, wherein the first bus system is electrically separate from the second bus system, and wherein said first control chip is configured to receive a first chip select signal and a second chip select signal and to transmit said first chip select signal to a subset of said plurality of memory chips of each of said memory units of said first group and to transmit said second chip select signal to another subset of said plurality of memory chips of each of said memory units of said first group.

24. The semiconductor memory system according to claim 23, wherein said plurality of memory chips of said memory units of said first group comprises a first memory chip disposed on said first surface of said circuit board, a second memory chip disposed on said first memory chip, a third memory chip disposed on said second memory chip and a fourth memory chip disposed on said third memory chip.

25. The semiconductor memory system according to claim 24, wherein said first control chip is adapted to transmit said first chip select signal to said first memory chip and to said third memory chip of each of said memory units of said first group and to transmit said second chip select signal to said second memory chip and said fourth memory chip of each of said memory units of said first group.

26. The semiconductor memory system according to claim 24, wherein said first control chip is adapted to transmit said first chip select signal to said first memory chip and to said second memory chip of said plurality of memory chips of said memory units of said first group and to transmit said second chip select signal to said third memory chip and to said fourth memory chip of said plurality of memory chips of said memory units of said first group.

27. A semiconductor memory arrangement comprising:

a substrate having at least a first and a second layer, said circuit board has a first end and a second end and a first surface and a second surface;

a plurality of means for storing data;

a first means for controlling and a second means for controlling adapted to receive control signals;

a first means for transmitting signals, said first means for transmitting signals disposed in said first layer of said substrate and being coupled to said first means for controlling and to a first group of means for storing data of said plurality of means for storing data to transmit said control signals to said first group of means for storing data; and a second means for transmitting signals, said second means for transmitting signals disposed in said second layer of said substrate and being coupled to said second means for controlling and to a second group of means for storing data of said plurality of means for storing data to transmit said control signals to said second group of means for storing data, wherein the first means for transmitting signals is electrically separate from the second means for transmitting signals, wherein said first group of means for storing data is disposed on said first surface of said circuit board and between said first end of said circuit board and said first means for controlling;

wherein said second group of means for storing data is disposed on said second surface of said circuit board and between said first end of said circuit board and said second means for controlling, and wherein each of said means for storing data includes a plurality of memory chips, said first means for controlling adapted to receive a first device select signal and a second device select signal and to transmit said first device select signal to a subset of each of said plurality of memory chips of said first means for storing data and to transmit said second device select signal to another subset of each of said plurality of memory chips of said first means for storing data.

* * * * *